United States Patent [19]

Elzer et al.

[11] Patent Number: 4,725,524
[45] Date of Patent: Feb. 16, 1988

[54] DRY FILM RESIST AND PRODUCTION OF RESIST IMAGES

[75] Inventors: Albert Elzer, Otterstadt; Gunnar Schornick, Neuleiningen; Axel Sanner, Frankenthal, all of Fed. Rep. of Germany

[73] Assignee: BASF Aktiengesellschaft, Ludwigshafen, Fed. Rep. of Germany

[21] Appl. No.: 810,168

[22] Filed: Dec. 18, 1985

[30] Foreign Application Priority Data

Dec. 24, 1984 [DE] Fed. Rep. of Germany ....... 3447357

[51] Int. Cl.$^4$ .......................... G03C 11/12; G03C 1/68
[52] U.S. Cl. ..................................... 430/258; 430/259; 430/260; 430/263; 430/262; 430/285; 430/287; 430/288; 430/910; 522/100; 522/101; 522/102; 522/103
[58] Field of Search ............... 430/285, 287, 284, 259, 430/262, 260, 263, 258, 288, 910; 522/100, 101, 102, 104, 106, 107, 108, 103

[56] References Cited

U.S. PATENT DOCUMENTS 3,469,982  9/1969  Celeste ................................ 430/256
4,304,923  12/1981  Rousseau ......................... 430/284 X

FOREIGN PATENT DOCUMENTS 1489425  10/1977  United Kingdom .

*Primary Examiner*—Paul R. Michl
*Assistant Examiner*—Cynthia Hamilton
*Attorney, Agent, or Firm*—Keil & Weinkauf

[57] ABSTRACT

In dry film resists possessing a solid photopolymerizable resist layer, which is applied on a temporary base and can be developed with aqueous, in particular aqueous alkaline, media, and, if required, a cover sheet on the resist layer, the said resist layer is built from a homogeneous mixture of (a) not less than 40% by weight of one or more oligomers which contain free carboxyl groups and more than two acryloyl and/or methacryloyl groups and are soluble or dispersible in aqueous alkaline solutions, (b) from 1 to 35% by weight of one or more film-forming compatible polymers which are soluble in aqueous media, (c) from 1 to 30% by weight of one or more compatible photopolymerizable monomers, (d) from 0.001 to 10% by weight of one or more photoinitiators and (e) from 0 to 30% by weight of further additives and/or assistants. Resist images are produced on a substrate by a process employing photopolymerizable resist layers of the type stated above.

14 Claims, No Drawings

DRY FILM RESIST AND PRODUCTION OF RESIST IMAGES

The present invention relates to a dry film resist which possesses a solid, photopolymerizable resist layer which is applied on a dimensionally stable, temporary base and can be developed with an aqueous, in particular aqueous alkaline, developer, and, if required, a cover sheet, which can be peeled off, on this resist layer. The present invention furthermore relates to a process for the production of resist images on a substrate, in which a photopolymerizable resist layer which is soluble or dispersible in aqueous, in particular aqueous alkaline, developers is applied onto the substrate, this resist layer is exposed imagewise to actinic light, and the unexposed parts of the resist layer are then washed out with the developer.

Dry film resists of the type under discussion are known and are widely used for the production of resist images in etching and electroplating and in the production of printed circuit boards, thin-film circuits and multilayer circuits. Because they can be processed with less pollution of the environment, the photoresists which can be developed with an aqueous developed are steadily becoming more important compared with the resists which can be developed with organic solvents. The photopolymerizable resist layer generally consists of a mixture of one or more polymeric binders which are soluble or dispersible in aqueous, in particular aqueous alkaline, media, one or more ethylenically unsaturated, photopolymerizable, low molecular weight compounds, one or more photoinitiators and, if required, further additives and/or assistants.

The polymeric binders proposed for the resist layers which can be developed with an aqueous developer are, in particular, polymers which contain carboxyl or carboxylic anhydride groups, e.g. alkyl (meth)acrylate/(meth)acrylic acid copolymers, styrene/maleic anhydride copolymers, styrene/maleic half ester copolymers or styrene/alkyl (meth)acrylate/(meth)acrylic acid copolymers (cf., inter alia, DE-B-No. 20 64 080, DE-A-No. 22 05 146 and EP-A-No. 49 504). The photopolymerizable low molecular weight compounds described for these resist layers comprise a very wide variety of acrylate and methacrylate compounds, the photopolymerizable resist layers usually containing from 40 to 90% by weight of the polymeric binders and from 10 to 60% by weight of the photopolymerizable low molecular weight compounds.

Apart from being capable of being developed with aqueous media, the photopolymerizable resist materials have to meet a variety of other requirements. For example, the photopolymerizable mixtures must possess good film-forming properties and be capable of being processed to solid, preferably non-tacky layers. The resist layers of the photoresist films must be capable of being laminated with substrates and exhibit good adhesion to these substrates. Moreover, the adhesion between photopolymerizable resist layer and cover sheet on the one hand and photopolymerizable resist layer and temporary base on the other hand, as well as between photopolymerizable resist layer and temporary base on the one hand and photopolymerizable resist layer and substrate on the other hand, must show good differentiation. Other requirements are short exposure and development times coupled with good differentiation between exposed and unexposed parts, and the formation of exact and crisp contours of the resist images. The developed resist images must moreover possess good mechanical properties and be resistant to chemicals, as used in further processing, in particular etching and electroplating baths. The dry film resists proposed to date and possessing photopolymerizable resist layers which can be developed with aqueous media do not meet the requirements set with regard to these materials.

DE-A-No. 27 36 058 describes a dry film resist which can be developed with purely aqueous alkaline media without the addition of organic substances and is also supposed to possess good chemical stability in the exposed state. The photopolymerizable resist layer of this dry film resist contains a carboxyl-containing, water-insoluble copolymer as a binder, a polar, hydroxyl-containing oligomer which is obtained by an addition reaction of a mono- or dicarboxylic acid, e.g. (meth)acrylic acid, maleic acid or fumaric acid, with an epoxy resin, and a polyfunctional (meth)acrylate monomer, the weight ratio of polymeric binder to oligomer to monomer being 1:0.15-1:0.15 - 1. This dry film resist too possesses unsatisfactory performance characteristics.

Furthermore, DE-A-No. 29 17 483 discloses photopolymerizable materials for the production of printing plates, which can be developed rapidly with basic solutions, are very radiation-sensitive and at the same time very insensitive to oxygen, and adhere well to certain bases, e.g. aluminum surfaces. These photopolymerizable materials essentially consist of an organic film-forming polymer, a polymerizable monomer, a polymerizable, carboxyl-containing, oligomeric urethane (meth)acrylate resin and a photoinitiator, the film-forming polymer, the monomer and the oligomer each being present in the photopolymerizable material in amounts of from 10 to 60% by weight. This publication gives no information regarding the production of resist images for the permanent modification of substrates, and the suitability of photopolymerizable materials of this type for the production of dry film resists.

Finally, DE-A-No. 24 47 527 and DE-C-No. 25 57 408 describe crosslinkable oligomeric resins which contain acryloyl and/or methacryloyl groups and carboxyl groups and are prepared by reacting polyepoxides, (meth)acrylic acid and cyclic dicarboxylic anhydrides, and, according to DE-C-No. 25 57 408, may also be prepared with the concomitant use of di- or polyisocyanates. It is also stated that these resins can be used in photopolymerizable resist layers; although the photopolymerizable resist layers described in these publications are comparatively insensitive to oxygen and, after exposure and development, exhibit good adhesion to metallic bases, they too are not completely satisfactory. For example, they tend in many cases to stick, the exposed layers are brittle and the tenting behavior or the differentiation in adhesion, required for dry film resists, between the resist layers on the one hand and the cover sheet and temporary base, or temporary base and substrate, on the other hand are inadequate.

It is an object of the present invention to provide a novel, improved dry film resist which possesses a photopolymerizable resist layer which can be developed with an aqueous, in particular aqueous alkaline, medium and has good processing properties and performance characteristics, and with which high quality resist images can be produced on a substrate by a conventional method.

We have found that this object is achieved by a dry film resist comprising a temporary base, a photopolymerizable resist layer which can be developed with an aqueous, in particular aqueous alkaline, medium and, if required, a cover sheet which can be peeled off, in which the photopolymerizable resist layer consists of a homogeneous, photopolymerizable mixture which contains special photopolymerizable oligomers, special polymeric binders, compatible photopolymerizable monomers, photoinitiators and, if required, further additives and/or assistants in a particular numerical ratio to one another.

The present invention accordingly relates to a dry film resist comprising a temporary, dimensionally stable base, a solid, photopolymerizable resist layer which is applied on the temporary base, can be laminated with a substrate by the use of pressure and, if necessary, heat, and is soluble or dispersible in aqueous, in particular aqueous alkaline, developers, and, if required, a cover sheet, which can be peeled off, on the photopolymerizable resist layer, wherein the photopolymerizable resist layer is built from a homogeneous mixture of (a) not less than 40, in particular more than 45, % by weight of one or more photopolymerizable oligomers which are soluble or dispersible in aqueous alkaline solutions, contain free carboxyl groups and more than two acryloyl and/or methacryloyl groups and have a mean molecular weight (number average) of from about 1000 to about 10000, (b) from 1 to 35, in particular from 10 to 30, % by weight of one or more film-forming polymers which are soluble or dispersible in water or in aqueous alkaline solutions, are compatible with the oligomers of component (a) and have a mean molecular weight (weight average) greater than 15000, (c) from 1 to 30, in particular from 10 to 25,% by weight of one or more photopolymerizable monomers which are compatible with the oligomers of component (a) and the polymers of component (b), (d) from 0.001 to 10, in particular from 0.1 to 5,% by weight of one or more photopolymerization initiators and (e) from 0 to 30, in particular from 0.05 to 12,% by weight of further additives and/or assistants, the percentages of the individual components each being based on the total mixture.

The present invention furthermore relates to a process for the production of resist images on a substrate, in which a solid, photopolymerizable resist layer which is soluble or dispersible in aqueous, in particular aqueous alkaline, developers, is applied onto the substrate, this resist layer is exposed imagewise to actinic light and the unexposed parts of the resist layer are then washed out with the developer. In the process, the photopolymerizable resist layer consists of a homogeneous, photopolymerizable mixture as stated above for the resist layer of the novel dry film resist.

Compared with the conventional photoresists, the photopolymerizable resist layers employed according to the invention for the production of the dry film resists and resist images possess a number of advantageous and, in some cases, surprising properties. The solid photopolymerizable resist layers are non-tacky and can be handled easily during processing, and without any special safety measures. They show a good differentiation in adhesion; any cover sheet present in the dry film resist can easily be peeled off. The photopolymerizable resist layer of the novel dry film resists can very readily be laminated and can be transferred easily to substrates, as employed as bases for the production of resist images, in particular metals or metallic or metal oxide surfaces. After lamination, the novel resist layer shows very good adhesion to the substrate, both in the unexposed and exposed states, without residual layers being formed during production of the resist images. After the resist layer has been laminated with the substrate, the temporary base of the dry film resist can readily be peeled off from the resist layer, advantageously prior to imagewise exposure. The novel photopolymerizable resist layers possess very good exposure properties and high resolving power and, when developed for a short time, in particular with an aqueous alkaline developer, permit very good and exact differentiation between exposed and unexposed parts, so that even resist images possessing fine image elements can be produced correctly and faithful to the original. The resist images produced according to the invention possess high mechanical stability and, in spite of the fact that they can be developed with aqueous media, are stable to the acidic etching and electroplating baths usually used; some of these resist images are also very stable in ammoniacal etching baths.

The temporary base of the novel dry film resists is dimensionally stable and preferably transparent. It exhibits moderate adhesion to the photopolymerizable resist layer so that it can be peeled off from the resist layer, after the latter has been laminated with the substrate and either before or after imagewise exposure of the resist layer, without the latter being detached from the substrate again or damaged in some other way during this procedure. The temporary base may also be soluble in the developer for the resist layer, so that it is washed away together with the unexposed parts of the resist layer during development of the resist image. In this case, it is not absolutely necessary for the temporary base to be capable of being peeled off from the photopolymerizable resist layer. The temporary base is formed from, in particular, a plastic film or sheet, for example a nylon, polyolefin, a polyester, a vinyl polymer, a cellulose ester or the like. Particularly preferred temporary bases are films or sheets of polyesters, e.g. polyethylene terephthalate or polybutylene terephthalate. The temporary base is in general from about 10 to 150 $\mu$m, in particular from about 20 to 40 $\mu$m, thick. It may be advantageous to use plastic films or sheets whose surfaces have been pretreated as a temporary base. A pretreatment of this type can comprise, for example, roughening the surface of the temporary base so that, for example, the photopolymerizable resist layer laminated to the substrate has a dull surface.

According to the invention, the photopolymerizable resist layer is built from one or more photopolymerizable oligomers (component a), one or more film-forming polymers (component b) which are soluble or dispersible in the aqueous developers, one or more photopolymerizable monomers (component c), one or more photopolymerization initiators (component d) and, if required, further additives and/or assistants (component e) in the particular proportions stated above. The individual components, in particular (a) to (c), are selected and matched up with one another so that they are compatible with one another and the actinic light used for imagewise exposure is not scattered in the resist layer. The photopolymerizable resist layer which is used according to the invention and can be developed in aqueous media is solid and nontacky, can be readily laminated and transferred to substrates, and is usually from about 15 to 70 μm thick, but may be thinner or thicker, depending on the field in which the photoresist is used.

The novel photopolymerizable resist layer contains, as component (a), one or more photopolymerizable and crosslinkable oligomers which are soluble or dispersible in aqueous alkaline solutions, preferably those having a pH of about 9–13, and contain free carboxyl groups and more than 2 acryloyl and/or methacryloyl groups. The mean molecular weight (number average) of the oligomers employed as component (a) is from about 1000 to about 10000, in particular from about 1500 to 6000. Preferably, oligomers of the type under discussion which are solid at room temperature are used. Particularly suitable components (a) are oligomeric resins prepared by polyaddition or polycondensation reactions. The oligomers contain more than two acryloyl and/or methacryloyl groups, and on average preferably have a total of about 2.1–8 acryloyl and/or methacryloyl groups per molecule. In particular, they contain on average a total of from 2.5 to 6 acrylic and/or methacrylic double bonds per molecule. Apart from the acryloyl and/or methacryloyl groups, the said oligomers generally contain no other, additional ethylenically unsaturated, photopolymerizable double bonds. One of the decisive factors determining the content of free carboxyl groups in the oligomers is the requirement that the oligomers be soluble or dispersible in aqueous alkaline solutions, although preferably not at a pH lower than 9. Accordingly, the acid number of the said oligomers is in general not less than 50 mg of KOH per g. The content of free carboxyl groups also depends on the other structural features of the particular oligomers, for example the content of free hydroxyl groups, the amount of hydrophilic ether segments, etc. Usually, the oligomers have an acid number of from 50 to 150, preferably from 60 to 120, mg of KOH per g. Since the photopolymerizable resist layers are preferably prepared from solution, the oligomers used according to the invention are advantageously soluble in organic solvents, preferably readily volatile, polar solvents, e.g. methanol, acetone, methyl ethyl ketone, ethyl acetate, etc., in order to facilitate processing.

The oligomers can be used in the photopolymerizable resist layers either alone or as a mixture with one another, and amount to not less than 40, in particular more than 45,% by weight of the photopolymerizable mixture forming the resist layer. The upper limit of the content of oligomers in the resist layer is determined by the amounts in which the other components are present in the photopolymerizable resist layer. Preferably, the content of oligomers of component (a) is not more than 90, preferably 75,% by weight, based on the photopolymerizable mixture forming the resist layer. According to the invention, photopolymerizable resist layers which have proven particularly advantageous are those which contain about 50–65% by weight, based on the photopolymerizable mixture forming the resist layer, of oligomers of component (a).

Examples of suitable components (a) are oligomeric, carboxyl-containing polyester acrylates and/or methacrylates, which may be obtained by various methods. For example, suitable oligomers are obtained if (meth)acryloyl-containing diols are subjected to a chain-extending reaction with polycarboxylic acids, in particular tri- or tetracarboxylic acids, or preferably their cyclic anhydrides. The (meth)acryloyl-containing diols may be, for example, reaction products of dicarboxylic acids with glycidyl (meth)acrylate. However, reaction products of epoxide compounds with (meth)acrylic acid, for example the reaction product of glycidol with (meth)acrylic acid, are also suitable. The reaction products of acrylic and/or methacrylic acid with diepoxides, in particular aromatic diepoxides, have proven particularly advantageous for the unsaturated diol component. Here, the reaction product of bisphenol A diglycidyl ether with acrylic and/or methacrylic acid in a molar ratio of 1:2 may be mentioned in particular. The (meth)acryloyl-containing diols can be used for the preparation of the carboxyl-containing oligomeric polyesters either alone or as a mixture with other, saturated diols, e.g. butane-1,4-diol, polyethylene glycols, polypropylene glycols, polybutylene glycols or the like. The ratio of the (meth)acryloyl-containing diols to the saturated diols depends on the desired content of acryloyl and/or methacryloyl groups in the oligomer (component a). In general, the amount of saturated diols is from 0 to 90, preferably from 50 to 80,% by weight, based on the total amount of diol component used for the preparation of the oligomeric polyesters. In addition to the tri- and tetracarboxylic acids, in particular the cyclic dianhydrides of tetracarboxylic acids have proven particularly advantageous as acid components for the preparation of the polyester oligomers, these acid components simultaneously being used as chain extenders for the diols and for introducing free carboxyl groups into the polyester oligomer. An example of such a dianhydride is pyromellitic anhydride. To prepare the oligomeric polyesters containing free carboxyl groups and (meth)acryloyl groups, the (meth)acryloyl-containing diols, if appropriate as a mixture with saturated diols, are reacted in a conventional manner with the carboxylic acids or their anhydrides, the ratio of the number of equivalents of diol component to that of carboxylic acid components being about 1:0.6.

The said polyesters, which can be used as component (a) for the photopolymerizable resist layers, can also be obtained, for example, by esterifying some of the hydroxyl groups of polyfunctional saturated polyester polyols with acrylic acid and/or methacrylic acid and then reacting some or all of the remaining hydroxyl groups with dicarboxylic acids or dicarboxylic acid derivatives, in particular cyclic dicarboxylic anhydrides. Examples of suitable starting materials for this purpose are the known polyester polyols, as can be obtained, for example, by reacting aliphatic and/or aromatic dicarboxylic acids or their derivatives with polyols which are trifunctional or of higher functionality, or mixtures of such polyols and diols, or by reacting dicarboxylic acids with di- or polyepoxides. Examples of other advantageous compounds are polyester polyols based on adipic acid and/or phthalic acid. Particularly suitable polyol components are triols or tetraols, e.g. 1,1,1-trimethylolpropane or pentaerythritol, if appropriate as a mixture with diols, e.g. ethylene glycol or propanediol. Suitable di- and polyepoxides are the known di- and polyglycidyl ethers and di- and polyglycidyl esters, in particular dior polyglycidyl ethers containing aromatic ring systems, e.g. bisphenol A bisglycidyl ether. Examples of dicarboxylic acids or dicarboxylic anhydrides with which the polyester polyols are modified to introduce the free carboxyl groups after some of the hydroxyl groups have been esterified with acrylic and/or methacrylic acid are adipic acid and phthalic acid, and in particular the cyclic dicarboxylic anhydrides, such as phthalic anhydride. The ratio in which the hydroxyl groups of the polyester polyols are reacted with the (meth)acrylic acid on the one hand and with the dicarboxylic acids or dicarboxylic acid derivatives on the other hand depends on the desired number of (meth)acryloyl and free carboxyl groups in the oligomers. Oligomeric polyesters of the type under discussion which have proven very useful for the photopolymerizable resist layers are those in which a total of from 50 to 100%, in particular from 70 to 90%, of the hydroxyl groups of the polyester polyols have been esterified with (meth)acrylic acid and with the dicarboxylic acids or dicarboxylic acid derivatives. The molar ratio of (meth)acrylic acid to the dicarboxylic acids or dicarboxylic acid derivatives is preferably from 0.25:1 to 2.5:1.

Examples of other oligomers which are suitable as component (a) of the novel photopolymerizable resist layers are oligomeric compounds containing free carboxyl groups and urethane (meth)acrylate groups. Such oligomers can be prepared, for example, by reacting some of the hydroxyl groups of polyols with urethane (meth)acrylates which still contain one or more isocyanate groups, and reacting some of these hydroxyl groups with polyfunctional carboxylic acids or their anhydrides, in particular dicarboxylic acids or dicarboxylic anhydrides. Suitable polyols for this purpose are any aromatic and/or aliphatic polyols. These include polyether polyols and polyester polyols, for example those discussed above in connection with the preparation of the (meth)acryloyl-containing and carboxyl-containing polyester oligomers, as well as polycaprolactone-polyols; the polyols can be straight-chain or branched. The acryloyl and/or methacryloyl groups are introduced into the oligomer by means of polyfunctional isocyanates, in particular diisocyanates, this advantageously being done by first preparing a urethane (meth)acrylate which still contains one or more isocyanate groups from the isocyanate and a hydroxyl-containing acryloyl or methacryloyl compound, and then reacting this isocyanatourethane (meth)acrylate with some of the hydroxyl groups of the polyols, with formation of urethane bonds. Examples of suitable isocyanates are toluylene diisocyanate, hexamethylene diisocynate, isophorone diisocyanate, diphenylmethane diisocyanate and the like. Particularly suitable hydroxyl-containing (meth)acryloyl compounds for the reaction with the isocyanates, preferably diisocyanates, are hydroxyalkyl (meth)acrylates and hydroxyalkyleneoxy (meth)acrylates, as well as N-methylolacrylamide and the like. The hydroxyl-containing acryloyl or methacryloyl compounds are reacted with the polyisocyanates in a molar ratio such that the resulting adducts still contain free isocyanate groups, preferably one free isocyanate group. For example, in the reaction of diisocyanates with hydroxyalkyl or hydroxyalkyleneoxy (meth)acrylates, the ratio of the number of equivalents of OH to that of NCO is about 1:2. The (meth)acryloyl-containing isocyanates, preferably monoisocyanates, are then reacted with some of the hydroxyl groups of the polyol component with formation of urethane bonds. The degree of conversion, i.e. the number of hydroxyl groups of the polyol which are reacted with the isocyanate, depends decisively on the desired number of acryloyl and/or methacryloyl groups in the oligomer. In this reaction, the ratio of the number of equivalents of OH to that of NCO is preferably from 1:0.2 to 1:0.8. To introduce the free carboxyl groups into the molecule, some or all of the remaining hydroxyl groups of the resulting oligomer containing urethane acrylate and/or urethane methacrylate groups are then reacted with polyfunctional carboxylic acids or their derivatives, in particular their anhydrides, preferably with dicarboxylic acids and especially cyclic dicarboxylic anhydrides, with esterification of some of the carboxyl groups of the polyfunctional carboxylic acids or carboxylic acid derivatives, i.e. with formation of acidic partial esters of these carboxylic acids. Examples of polyfunctional carboxylic acids and their derivatives are succinic acid, adipic acid, phthalic acid, terephthalic acid and their anhydrides, in particular phthalic anhydride.

The oligomers which can be used as component (a) for the photopolymerizable resist layers may furthermore be oligomeric urethane resins containing free carboxyl groups and acryloyl and/or methacryloyl groups. Such oligomeric urethane resins can be prepared by, for example, reacting polyols and/or diols containing acryloyl and/or methacryloyl groups with di- and/or polyisocyanates in the presence or absence of further diols, with chain extension and formation of an oligomeric urethane resin, so that only some of the hydroxyl groups of the diols and/or polyols are converted to urethane groups, some or all of the remaining hydroxyl groups of the resulting urethane resins then being esterified with polybasic carboxylic acids or their derivatives, in particular cyclic dicarboxylic anhydrides, with formation of acidic partial esters of the said carboxylic acids. The (meth)acryloyl-containing diols or polyols for the reaction with the di- and/or polyisocyanates can be obtained by, for example, reacting di- or polyepoxides with acrylic and/or methacrylic acid in an amount such that preferably about 50–100% of the glycidyl groups are converted to $\beta$-hydroxyacrylate and/or $\beta$-methacrylate groups. Examples of suitable di- and polyepoxide compounds are on the one hand the di- and polyglycidyl ethers of dihydric or polyhydric alcohols and in particular dihydric or polyhydric phenols, for example the diglycidyl ether of epichlorohydrin and bisphenol A, and on the other hand di- and polyglycidyl esters of polybasic aliphatic, cycloaliphatic and in particular aromatic carboxylic acids, e.g. diglycidyl phthalate, diglycidyl isophthalate and diglycidyl terephthalate. The di- and polyepoxides may furthermore be subjected, before or during the reaction with the acrylic and/or methacrylic acid, to a chain-extending reaction with aliphatic or aromatic dicarboxylic acids, e.g. adipic acid or phthalic acid. The di- and polyisocyanates which are suitable for further conversion of the resulting polyhydroxy (meth)acrylates include, in particular, aliphatic, cycloaliphatic and aromatic diisocyanates, e.g. hexamethylene diisocyanate, cyclohexane diisocyanate, toluylene diisocyanate, isophorone diisocyanate and others. The reaction with the isocyanates takes place with chain extension and formation of a urethane oligomer which still contains residual hydroxyl groups. Thereafter, the free hydroxyl groups still remaining in the oligomer are reacted with polybasic carboxylic acids or their derivatives, in particular aliphatic or aromatic dicarboxylic anhydrides, especially the cyclic carboxylic anhydrides, e.g. phthalic anhydride, with formation of the corresponding acidic carboxylic half esters. To prepare these oligomeric urethane resins containing carboxyl groups and acryloyl and/or methacryloyl groups, the di- or polyepoxides are reacted with the (meth)acrylic acid, the ratio of the number of equivalents of glycidyl radicals to that of carboxylic acid radicals preferably being from 1:0.5 to 1:1; urethane groups are then introduced into the di- or polyhydroxy (meth)acrylates resulting from this reaction by reacting them with di- and/or polyisocyanates, preferably in an amount such that the number of equivalents of OH to that of NCO is from 1:0.2 to 1:0.8. Some or all of the remaining hydroxyl groups of the resulting urethane oligomers are then reacted with the polyfunctional carboxylic acids or their derivatives with formation of the acidic partial esters of these carboxylic acids to the extent necessary to establish the required and desired acid number of the oligomer.

Oligomers employed according to the invention as component (a) of the photopolymerizable resist layers may also be prepared, for example, by starting from an oligomeric resin which carries several glycidyl groups and has the appropriate molecular weight, and reacting some of the glycidyl groups with acrylic acid and/or methacrylic acid and the remainder of the glycidyl groups with polybasic carboxylic acids, in particular dicarboxylic acids, e.g. phthalic acid, terephthalic acid, hexahydrophthalic acid, succinic acid, adipic acid and the like, with formation of the acidic partial esters of these polycarboxylic acids. It is also possible to introduce the acryloyl and/or methacryloyl groups into an oligomeric resin carrying several free carboxyl groups by reacting some of the free carboxyl groups of this resin with epoxide-containing acrylates and/or methacrylates, e.g. glycidyl acrylate and/or methacrylate.

Oligomers which have proven particularly advantageous for component (a) of the photopolymerizable resist layers because of the good and advantageous properties of the dry film resists and resist images produced according to the invention using these oligomers, for example the good stability of the resist images even in ammoniacal etching baths, are epoxide-based oligomers containing free carboxyl groups and acryloyl and-/or methacryloyl groups, as are obtained by reacting diol or polyol compounds containing acryloyl and/or methacryloyl groups with polyfunctional carboxylic acids or their derivatives, in particular cyclic carboxylic anhydrides, with formation of the acidic partial esters of these carboxylic acids or carboxylic acid derivatives, and then subjecting some of the free carboxyl groups of the resulting reaction product to a chain-extending reaction with a di- and/or polyepoxide compound. Particularly suitable (meth)acryloyl-containing diol or polyol compounds for the preparation of these oligomers are reaction products of acrylic and/or methacrylic acid with di- or polyepoxide compounds or with OH-containing monoepoxides, for example glycidol. Suitable di- or polyepoxides for the reaction with (meth)acrylic acid are compounds containing two or more glycidyl groups, e.g. di- or polyglycidyl ethers of polyhydric alcohols and in particular polyhydric phenols, and di- or polyglycidyl esters of polybasic aliphatic, cycloaliphatic and in particular aromatic carboxylic acids; the aromatic di- and polyglycidyl compounds in which the glycidyl radicals are bonded directly or indirectly to mononuclear or polynuclear, unsubstituted or substituted aromatic rings or ring systems are particularly advantageous here. Examples of suitable di- and polyglycidyl ethers are the reaction products of epichlorohydrin with bisphenol A or bisphenol A derivatives, for example substitution products of bisphenol A. Suitable di- and polyglycidyl esters include diglycidyl phthalate, diglycidyl isophthalate, diglycidyl terephthalate and diglycidyl hexahydrophthalate. The stated di- and polyepoxides may furthermore be subjected, before or during the reaction with the acrylic and/or methacrylic acid, to a preliminary chain-extending reaction with aliphatic, cycloaliphatic or aromatic dicarboxylic acids or derivatives of these which are reactive toward glycidyl groups. Examples of suitable compounds for this purpose are phthalic acid, isophthalic acid, terephthalic acid, hexahydrophthalic acid, malonic acid, succinic acid, methyl-Succinic acid, adipic acid and their derivatives which are reactive toward glycidyl groups; phthalic acid and adipic acid and their derivatives are preferred. The di- or polyepoxides, which may or may not have been subjected to a preliminary chain-extending reaction, are reacted with the acrylic and/or methacrylic acid in particular in an amount such that the ratio of the number of equivalents of glycidyl groups to that of COOH groups is from 1:0.5 to 1:1, in particular about 1:1. If the said preliminary chain-extending reaction is carried out simultaneously with the reaction with the acrylic and/or methacrylic acid, i.e. if the di- or polyepoxides are reacted with a mixture of dicarboxylic acids or dicarboxylic acid derivatives of the stated type and acrylic and/or methacrylic acid, the carboxylic acid mixture preferably contains the dicarboxylic acids or their derivatives on the one hand and the acrylic acid and/or methacrylic acid on the other hand in amounts of from 30 to 70 mol % based on the carboxylic acid mixture, in each case, and the ratio of the number of equivalents of glycidyl groups to the total number of equivalents of COOH groups in this reaction is in particular about 1:1. (Meth)acryloyl-containing diol or polyol compounds which have proven advantageous for the preparation of oligomers of this type are, for example, those which are obtained by reacting bisphenol A diglycidyl ethers, in particular the diglycidyl ether obtainable from bisphenol A and epichlorohydrin, with acrylic acid in an amount such that the ratio of the number of equivalents of glycidyl groups to that of COOH groups is about 1:1, or by reacting bisphenol A diglycidyl ethers, in particular the diglycidyl ether obtainable by reacting epichlorohydrin with bisphenol A, with a mixture of adipic acid and acrylic acid in an amount such that the ratio of the number of equivalents of glycidyl groups to that of COOH groups of the adipic acid to that of COOH groups of the acrylic acid is 1:0.4–0.6:0.6–0.4 and the ratio of the number of equivalents of glycidyl groups to the total number of equivalents of COOH groups is about 1:1. To introduce the free carboxyl groups, these diol or polyol compounds containing acryloyl and/or methacryloyl groups are reacted with polybasic carboxylic acids of their derivatives, in particular cyclic carboxylic anhydrides, for example dicarboxylic acids or their derivatives, in particular cyclic dicarboxylic anhydrides, in a manner such that the hydroxyl groups of the diol or polyol compounds react with the polybasic carboxylic acids or their derivatives with formation of acidic partial esters of these carboxylic acids. If the said diol or polyol compounds also contain glycidyl groups by virtue of their method of preparation, these groups too are reacted with the polybasic carboxylic acids or their derivatives. Preferably, the reaction is carried out so that all hydroxyl groups and any glycidyl groups still present in the diol or polyol compound are reacted with the polybasic carboxylic acids or their derivatives with formation of the acidic partial esters of these carboxylic acids. Particularly suitable polybasic carboxylic acids and their derivatives are the aliphatic, cycloaliphatic and, preferably, aromatic dicarboxylic acids and their anhydrides, and especially the cyclic anhydrides of di- and/or tricarboxylic acids. Examples of dicarboxylic acids and their derivatives which are suitable for this reaction are phthalic acid, isophthalic acid, terephthalic acid, trimellitic acid, hexahydrophthalic acid, malonic acid, succinic acid, adipic acid and others, and in particular their anhydrides. The aromatic di- and/or tricarboxylic acids, and especially their cyclic anhydrides, such as phthalic anhydride or mixtures of phthalic anhydride with other polybasic carboxylic acids or carboxylic anhydrides, in particular mixtures of phthalic anhydride with trimellitic anhydride, have proven particularly advantageous here. The mixtures of phthalic anhydride with the other polybasic carboxylic acids or carboxylic anhydrides preferably contain about 65-95, in particular 75-90, mol % of phthalic anhydride and about 5-35, in particular 10-25, mol % of the other polybasic carboxylic acids or carboxylic anhydrides. In the reaction of the diol or polyol compounds containing acryloyl and/or methacryloyl groups, with the cyclic carboxylic anhydrides, the ratio of the number of equivalents of OH groups to that of anhydride groups is preferably from about 1:0.8 to 1:1.2. Some of the free carboxyl groups formed in the partial esterification of the polybasic carboxylic acids or carboxylic acid derivatives with the diol or polyol compounds containing acryloyl and/or methacryloyl groups are then reacted with di- and/or polyepoxides with chain extension and, if required, branching to give the desired oligomers. The di- and polyepoxides used for chain extension and, where relevant, branching can in principle be any compounds containing two or more glycidyl groups, for example the reaction products of epichlorohydrin with di- or polyols, the reaction products of epichlorohydrin with di- or polyamines, polyolefin epoxides, epoxy resins of the novolak type and glycidyl esters of di- or polycarboxylic acids. For example, di- and polyglycidyl ethers of aliphatic di- and polyols, such as those of butane-1,4-diol, glycerol, trimethylolpropane, pentaerythritol or polyethylene glycols, as well as di- and polyglycidyl ethers of mononuclear or polynuclear aromatic di- and polyhydroxy compounds, such as those of polyhydric phenols, and the di- and polyglycidyl esters of aliphatic, cycloaliphatic or aromatic di- or polycarboxylic acids, e.g. adipic acid, hexahydrophthalic acid, phthalic acid, isophthalic acid or terephthalic acid, are also suitable. The di- and polyglycidyl ethers of aliphatic di- and polyols, e.g. pentaerythritol triglycidyl ether, and the bisglycidyl ethers of bisphenol A or the substitution products of bisphenol A, e.g. the bisglycidyl ether of epichlorohydrin and bisphenol A, have proven particularly advantageous here. In the chain-extending reaction of the free carboxyl groups of the reaction product with the di- and/or polyepoxides which is produced beforehand, the ratio of the number of equivalents of COOH groups to that of glycidyl groups is less than 1:1, preferably from about 1:0.8 to 1:0.2, in particular from abOut 1:0.6 to about 1:0.25.

The oligomers employed as component (a) of the novel photopolymerizable resist layer can be prepared by a conventional procedure for polycondensation or polyaddition reactions, advantageously in solution and in the presence or absence of a suitable catalyst. The reactions are advantageously carried out in such a way that the resulting oligomers are soluble in organic solvents. This is important with regard to the processability of the oligomers during the production of the novel photopolymerizable resist layers. Oligomeric resins of the type under discussion which are prepared by a polycondensation or polyaddition reaction and free of urethane groups, in particular those based on di- and/or polyepoxides and especially those which are obtainable by the preparation method discussed immediately above, are preferably employed as component (a).

In addition to the stated oligomers, the novel photopolymerizable resist layers contain, as component (b), from 1 to 35, in particular from 10 to 30,% by weight, based on the homogeneous mixture forming the photopolymerizable resist layer, of one or more polymers which are compatible with the oligomers of component (a). These polymers should possess film-forming properties and be soluble or dispersible in water or in aqueous alkaline solutions as used for the development of the imagewise exposed resist layers. Regarding the processability and production of the photopolymerizable resist layers, the polymers should preferably also be soluble in low-boiling organic solvents, like the oligomers of component (a). Advantageously, the oligomers of component (a) and the polymers of component (b) are soluble in the same organic solvents or solvent mixtures. The mean molecular weight (weight average) of the polymers of component (b) is higher than about 15000, in general higher than 20000, in particular from 10000 to 500000, preferably from 20000 to 250000.

Examples of water-soluble polymers which can be present as component (b) in the photopolymerizable resist layers are the corresponding film-forming homopolymers and copolymers of N-vinyllactams, in particular those of N-vinylpyrrolidone and N-vinylcaprolactam, e.g. poly-N-vinylpyrrolidone, N-vinylpyrrolidone/vinyl acetate copOlymers and in particular N-vinylpyrrolidone/vinyl propionate copolymers, the amount of N-vinylpyrrolidone in these copolymers preferably being from about 50 to 90% by weight, based on the copolymer. The water-soluble polymers are suitable as component (b) in the novel photopolymerizable resist layers, particularly when the resist is to be used for etching applications. For other fields of use, in particular for electroplating, the purely water-soluble polymers are less advantageous as component (b).

Film-forming polymers which are preferably employed as component (b) in the novel photopolymerizable resist layers are those which are soluble or dispersible in aqueous alkaline solutions, in particular at a pH of about 9-13, but preferably not at a pH of less than about 9. These include the polymeric binders conventionally used for photopolymerizable resist layers which can be developed with aqueous media. These binders are, in particular, copolymers of one or more vinyl monomers, which as such form water-insoluble homopolymers, with one or more monomers possessing free acid groups, in particular sulfo or carboxyl groups, or possessing cyclic anhydride groups. Examples of the vinyl monomers are vinylaromatics, in particular styrene or substituted styrenes, esters of acrylic acid or methacrylic acid, e.g. acrylates or methacrylates of alkanols of 1 to 20 carbon atoms, e.g. methyl (meth)acrylate, ethyl (meth)acrylate, butyl (meth)acrylate or hexyl (meth)acrylate, glycidyl (meth)acrylate and the like, (meth)acrylonitrile, vinyl acetate, vinyl propionate, vinyl chloride, vinyl alkyl ketones, in particular thoSe where alkyl is of 1 to 4 carbon atoms, and vinyl alkyl ethers, in particular those where alkyl is of 1 to 8 carbon atoms. In the second group of comonomers, the monomers possessing the acidic groups or the cyclic anhydride groups, particular examples are acrylic acid, methacrylic acid, crotonic acid, maleic acid, fumaric acid, maleic acid half esters and maleic anhydride. In addition to the two above-mentioned groups of comonomers, another group of comonomers for the polymers of component (b) which are used according to the invention comprises N-vinylamides, e.g. N-vinylformamide, N-vinylacetamide or N-vinyl-N-methylacetamide, and preferably N-vinyllactams, in particular N-vinylpyrrolidone and N-vinylcaprolactam.

Examples of the polymers which are soluble or dispersible in the aqueous alkaline solutions and are suitable as component (b) are the copolymers of the following type, which may or may not contain other comonomers as polymerized units: styrene/maleic anhydride copolymers, styrene/maleic acid half ester copolymers, styrene/maleic anhydride/(meth)acrylic acid copolymers, alkyl (meth)acrylate/(meth)acrylic acid copolymers, styrene/alkyl (meth)acrylate/(meth)acrylic acid copolymers and the like. Copolymers which are soluble or dispersible in aqueous alkaline solutions and which have proven particularly advantageous for component (b) of the novel photopolymerizable resist layers are those which contain N-vinylamides as copolymerized units. These include in particular the copolymers which contain, as copolymerized units, one or more N-vinylamides, in particular those of the type stated above, and acrylic acid and/or methacrylic acid, as well as one or more hydrophobic vinyl monomers which as such form homopolymers which are insoluble in water or aqueous alkaline solutions, as likewise mentioned above. Preferred copolymers of this type contain, as copolymerized units, N-vinyllactams, such as N-vinylpyrrolidone or N-vinylcaprolactam, acrylic acid and/or methacrylic acid, and, as other, hydrophobic comonomers, unsubstituted or substituted styrenes and/or alkyl (meth)acrylates, in particular styrene itself and/or methyl methacrylate. The suitable N-vinylamide copolymers contain in general from 10 to 50, preferably from 20 to 45,% by weight of the N-vinylamides, from 5 to 30, in particular from 5 to 15, % by weight of acrylic and/or methacrylic acid and from 30 to 80, preferably from 40 to 70,% by weight of the other hydrophobic vinyl monomers as copolymerized units, each of the stated percentages being based on the copolymer.

The polymers used as component (b) of the novel photopolymerizable resist layers can be prepared by the conventional polymerization methods.

In addition to the oligomers (component (a)) and the film-forming polymers (component (b)), the novel photopolymerizable resist layers contain from 1 to 30, in particular from 10 to 25,% by weight, based on the mixture forming the photopolymerizable resist layer, of one or more photopolymerizable monomers as component (c). These monomers, which usually have a boiling point of above 100° C. under atmospheric pressure, generally have a molecular weight of less than 10000. The photopolymerizable monomers, which can be used alone or as a mixture with one another, may be either monofunctional or polyfunctional, i.e. they can possess one or more photopolymerizable ethylenic double bonds. Advantageously, the said resist layer contains, as component (c), monomers possessing two or more photopolymerizable ethylenic double bonds. These bifunctional or polyfunctional monomers can be used alone, as a mixture with one another or as a mixture with monofunctional monomers, i.e. monomers possessing only one photopolymerizable ethylenic double bond. Preferably used monomers are those which possess one or more terminal vinyl or vinylidene double bonds, and in particular those in which the photopolymerizable double bond or bonds is or are activated by conjugation or by virtue of being adjacent to O, N or S atoms.

Typical exampLes of the photopolymerizable monomers in addition to the allyl compounds, e.g. allyl acrylate and diallyl phthalate, and vinyl compounds, e.g. N-vinyllactams and in particular N-vinylpyrrolidone or N-vinylcaprolactam, are primarily the monomers containing acryloyl and/or methacryloyl groups. These include in particular the esters of acrylic acid and methacrylic acid, such as the di- and tri-(meth)acrylates of, for example, ethylene glycol, diethylene glycol, triethylene glycol or polyethylene glycols having a molecular weight as high as about 500, propane-1,2-diol, propane-1,3-diol, polypropylene glycols having a molecular weight as high as about 500, butane-1,4-diol, 1,1,1-trimethylolpropane, 2,2-dimethylpropanediol, glycerol or pentaerythritol; pentaerythritol tetra(meth)acrylate or glucose tetra(meth)acrylate; urethane acrylates and methacrylates possessing 2 or more acryloyl or methacryloyl groups, as can be prepared, for example, by reacting aliphatic diols or polyols of the above type with organic diisocyanates, e.g. hexamethylene diisocyanate, in amounts such that the ratio of the number of equivalents of OH to that of NCO is about 1:2, and then reacting the free isocyanate groups with monohydroxy(-meth)acrylates, in particular hydroxyalkyl (meth)acrylates; (meth)acrylates containing two or more acryloyl and/or methacryloyl groups, as can be obtained by reacting acrylic acid and/or methacrylic acid with di-or polyglycidyl compounds, in particular di- or polyglycidyl ethers, for example the reaction product of 2 moles of acrylic acid and/or methacrylic acid with one mole of bisphenol A bisglycidyl ether. Examples of monofunctional monomers are the monoacrylates and monomethacrylates of monoalkanols, in particular those of 1 to 20 carbon atoms, or of the abovementioned diols and polyols. The particularly preferred monomers include trimethylolpropane triacrylate, trimethylolpropane trimethacrylate, pentaerythritol tri- and tetraacrylate and pentaerythritol tri- and tetramethacrylate.

The novel photopolymerizable resist layer contains one or more photopolymerization initiators as component (d). Particularly suitable initiators are the photoinitiators or photoinitiator systems conventionally used for the production of photopolymerizable resist layers. They include benzoin and benzoin derivatives, such as benzoin ethers; substituted benzoins and substituted benzoin derivatives, e.g. substituted benzoin ethers; benzils, in particular benzil ketals, e.g. benzil dimethyl ketal, benzil methyl ethyl ketal or benzil methyl benzyl ketal; and the benzoyldiarylphosphine oxides which are known, effective photoinitiators. Particularly advantageous photopolymerization initiators are compounds of the benzophenone type and derivatives thereof, e.g. benzophenone, 4,4'-dimethylaminobenzophenone, 4,4'-diethylaminobenzophenone, derivatives of Michler's ketone, 4,4'-dichlorobenzophenone, etc., as well as mixtures of these, in particular mixtures of benzophenone and Michler's ketone; hexaarylbisimidazoles, e.g. 2,2'-o-chlorophenyl-4,4',5,5'-p-methoxyphenylbisimidazole, and mixtures of hexaarylbisimidazoles with sensitizing agents, such as 2-mercaptobenzoquinazole; unsubstituted or substituted polynuclear quinones, such as anthraquinone, benzanthraquinone, 2-ethylanthraquinone or tert.-butylanthraquinone; and the acridine or phenacine derivatives which are effective photoinitiators. Typical examples of photoinitiator systems are combinations of benzophenone or benzophenone derivatives with tertiary amines, such as triethanolamine or Michler's ketone, and mixtures of hexaarylbisimidazoles and triphenylmethaneleuko dyes, e.g. leuko crystal violet, leuko malachite green or tris-(4-diethylamino-2-methylphenyl)-methane. The range of suitable photoinitiators and photoinitiator systems is familiar to the skilled worker. The photoinitiators can be used alone or as a mixture with one another, and are present in the novel photopolymerizable resist layer in amounts of from 0.001 to 10, in particular from 0.1 to 5, % by weight, based on the photopolymerizable resist layer.

In addition to components (a) to (d), the photopolymerizable resist layer according to the invention may contain, as component (e), further additives and/or assistants which improve and/or modify the processing properties and/or performance characteristics of the resist layer. These include thermal polymerization inhibitors, e.g. hydroquinone, hydroquinone derivatives, 2,6-di-tert.-butyl-p-cresol, nitrophenols, N-nitrosamines, such as N-nitrosodiphenylamine or the salts of N-nitrosocyclohexylhydroxylamine; dyes and/or pigments, which can act as contrasting agents as well as reinforcing the layer, for example Brilliant Green Dye (C.I. 42,040), Victoria Sky Blue FGA, Victoria Sky Blue BO (C.I. 42,595), Victoria Blue B (C.I. 44,045), Rhodamine 6 G (C.I. 45,160) or 3'-phenyl-7-dimethylamino-2,2'-spiro-di-(2H-1-benzopyran); photochromic compounds or photochromic systems which undergo a reversible or irreversible color change on exposure to actinic light, for example the leuco bases of triarylmethane dyes, e.g. malachite green leuco base or crystal violet leuco base, or rhodamine B base together with a suitable activator, for example an organic compound which eliminates halogen radicals on exposure to actinic light, or hexaarylbisimidazoles. The photopolymerizable resist layer may furthermore contain sensitometric regulators, e.g. 9-nitroanthracene, 10,10'-bisanthrones, phenazinium, phenoxazinium, acridinium or phenothiazinium dyes, in particular in combination with mild reducing agents, 1,3-dinitrobenzenes and the like, as well as fillers, reinforcing agents or other additives which improve the mechanical properties. The said resist layer may also contain plasticizers, although, owing to the composition of the novel photopolymerizable resist layer, it is unnecessary, and therefore generally not advantageous, to add plasticizers separately in this way. Where additional plasticizers are used in small amounts, examples of suitable plasticizers for this purpose are those which are known per se and are compatible. The other additives and/or assistants (component e) are present in the photopolymerizable resist layer in the effective amounts conventionally employed for these compounds. The total amount of these compounds is not more than 30, preferably from 0.05 to 12,% by weight, based on the photopolymerizable resist layer.

Apart from the type of compounds for the individual components of the novel photopolymerizable resist layer, the amounts in which they are present in the resist layer are also important. We have in fact found that the desired balanced and required properties of the dry film resist or of the resist image produced from this are achieved only if the individual components are present in the photopolymerizable resist layer in the stated ratios matched up with one another. If, for example, the amount of the polymer (component b) is increased to 40% by weight or more at the expense of the oligomers (component (a) and/or of the monomers (component (c)), as is generally the case with the conventional photoresist layers, the exposure and development properties of the resist layer are adversely affected to a marked extent; for example, the differentiation in solubilities between exposed and unexposed parts after imagewise exposure to actinic light becomes substantially poorer and the latitude for development is substantially restricted, and, during development of the resist image, fine and very fine image elements easily become detached or an unsatisfactory resist image is formed. If, on the other hand, the photopolymerizable resist layer contains no polymers or only an excessively small amount of polymers, it can frequently be laminated and transferred to substrates only with difficulty, if at all, and is therefore not very suitable for dry film resist materials. We have also found that, in these cases, the resist image produced, i.e. the exposed resist layer, can be stripped off from the substrate only with very great difficulty, if at all. If the amount of monomers (component (c)) is too high, not only is the exposure latitude substantially restricted, but the adhesion of the resist layer to the substrate after transfer of the layer is also adversely affected. If, on the other hand, the amount of monomers in the photopolymerizable resist layer is too low, the photosensitivity and the development characteristics are adversely affected. The composition of the said resist layer is also of importance with regard to the required differentiation in adhesion in the dry film resists.

A typical example of a very advantageous photopolymerizable resist layer according to the invention has the following composition:
  (a) from 45 to 75% by weight of one or more urethane-free oligomers which contain acryloyl and/or methacryloyl groups and free carboxyl groups and are based on di- or polyepoxide compounds, as can be obtained, for example, by reacting di- and/or polyepoxides with acrylic acid and/or methacrylic acid and polybasic carboxylic acids or their derivatives, in particular their anhydrides, by one of the procedures described in detail above,
  (b) from 10 to 30% by weight of one or more film-forming polymers which are insoluble in pure water but soluble or dispersible in aqueous alkaline media, in particular an N-vinyllactam copolymer,
  (c) from 10 to 25% by weight of one or more tri- and/or tetra(meth)acrylate monomers or a mixture of these containing a minor amount of mono- and/or difunctional (meth)acrylate monomers, and
  (d)+(e) together from 1 to 10% by weight of photoinitiators and other additives and/or assistants, the amount of the photoinitiator or photoinitiators preferably being from 0.1 to 5% by weight, and the stated percentages of the individual components being based in each case on the total photopolymerizable resiSt layer.

A cover sheet which is capable of being peeled off can, if desired, be applied on top of the photopolymerizable resist layer of the novel dry film resist. This cover sheet, which preferably consists of a thin plastic film or sheet, for example polyethylene, polypropylene or the like, should exhibit less adhesion to the photopolymerizable resist layer than that shown by the temporary base, so that the cover sheet can easily be peeled off from the said resist layer before the latter is laminated with the substrate. The cover sheet is in general from about 20 to 30 μm thick.

The novel dry film resist can be produced in a conventional manner by applying a layer of a homogeneous mixture of the components forming the photopolymerizable resist layer onto the temporary base and, if required, then providing this photopolymerizable resist layer with the cover sheet. The said resist layer is advantageously applied onto the temporary base by casting from solution and evaporating the solvent, or by any other conventional, suitable procedure. Advantageous solvents for this purpose include lower alkanols, ketones and esters, e.g. methanol, acetone, methyl ethyl ketone, ethyl acetate and the like.

In order to produce the resist image, the photopolymerizable resist layer possessing the composition according to the invention is applied to the substrate to be protected and, if required, to be permanently modified. Suitable substrates, the type of which is known to depend on the particular intended use of the resist image being produced, are the materials conventionally employed in this field. For example, copper sheets or copper-clad bases are used as substrates for the production of etch resists or plating resists as required, for example, in the manufacture of printed circuit boards or printed circuits. Thin-film circuits or multi-layer circuits are produced by processing, in particular, ceramic substrates, which are coated with metallic or metal oxide layers, or semiconductor elements. Substrates frequently used in semiconductor technology are silicon, GaAs or Ge wafers which may be provided on the surface with an oxide layer or a general insulating layer. For the production of permanent, imagewise structured protective or insulating layers, in particular soldering masks, the photopolymerizable resist layers are applied, for example, onto the circuit diagram of a printed circuit or a printed circuit board provided with holes. The photopolymerizable resist layers possessing the composition according to the invention exhibit very good adhesion to the conventionally used substrates, in particular those having metallic or metal oxide surfaces.

Although the said resist layer can be applied to the substrate by any conventional method, such as casting from solution, dip-coating, lip casting, spin coating, etc., it is applied as a rule in a very advantageous manner by lamination by means of the novel dry film resist. In this procedure, any cover sheet present is first peeled off, after which the free surface of the photopolymerizable resist layer of the dry film resist is laminated with the surface of the substrate using pressure and, if required, heat. Moreover, before being applied onto the substrate, the photopolymerizable resist layer can be preexposed uniformly to actinic light for a short time from that surface which faces away from the temporary base, i.e. from the side which is laminated with the substrate. This permits the subsequent principal, imagewise exposure of the resist layer to be carried out for a shorter time, and the uniform preexposure does not have an adverse effect on the imagewise differentiation and structuring of the resist layer. Such a preexposure has proven particularly advantageous when dry film resists having a relatively thick photopolymerizable resist layer are employed, since in these cases relatively long exposure times would otherwise be required. After the photopolymerizable resist layer has been laminated with the substrate, the temporary base of the dry film resist is peeled off from the resist layer, this being done either before or after the imagewise exposure of the photopolymerizable resist layer, preferably before the said exposure.

When the photopolymerizable resist layer has been applied onto the substrate, the resist layer is exposed imagewise to actinic light in order to produce the desired resist image. The wavelength of the actinic light used is advantageously matched up with the intrinsic absorption of the photopolymerization initiator present in the photopolymerizable layer. Usually, the wavelength of the actinic light used for the imagewise exposure is about 300–420 nm. Suitable sources of actinic light are the conventional light sources, for example carbon arc lamps, high pressure, medium pressure or low pressure mercury lamps, high pressure xenon lamps, UV fluorescent tubes, superactinic fluorescent tubes, low pressure mercury fluorescent lamps, etc., and UV lasers which emit light in the actinic wavelength range. Imagewise exposure of the resist layer can be effected by means of an imagewise modulated laser beam or by using diffuse light and a suitable transparency, for example a photographic transparency, e.g. a photographic negative or positive, whose opaque areas are virtually completely opaque to the actinic radiation used.

The duration of imagewise exposure depends not only on the composition of the photopolymerizable resist layer but, inter alia, also on its thickness and the intensity of the radiation. Usually, imagewise exposure is carried out for from 5 to 15 sec, and the optimum exposure conditions can readily be determined in a known manner by simple preliminary experiments. If, as stated above, the photopolymerizable resist layer is preexposed uniformly for a short time before being laminated with the substrate, the duration of this preexposure can be up to about 70% of that of the principal imagewise exposure. The uniform preexposure and the principal imagewise exposure can be carried out using the same radiation source or different radiation sources.

After imagewise exposure of the resist layer, the unexposed parts of the layer are removed with an aqueous developer in a conventional manner, for example by spraying, washing out, rubbing out or brushing out with the developer. Depending on the composition of the photopolymerizable resist layer, the aqueous developer used can be, for example, water or a water/alcohol mixture which contains a predominant amount of water; however, particularly suitable developers are aqueous alkaline developers which contain alkaline substances, e.g. borax, disodium hydrogen phosphate, sodium carbonate, an alkali metal hydroxide or an organic base, such as di- or triethanolamine, dissolved in water, in order to establish the most advantageous pH, which is in general about 8–14, preferably 9–13. The aqueous alkaline developers may furthermore contain conventional buffer salts, for example water-soluble alkali metal phosphates, alkali metal silicates, alkali metal borates, alkali metal acetates or alkali metal benzoates. Wetting agents, preferably anionic wetting agents, and, if required, water-soluble polymers, e.g. sodium carboxymethylcellulose, polyvinyl alcohol, polysodium acrylate and the like, may also be present as further components of these developers. Although not necessary, it is however also possible for small amounts of water-soluble, organic solvents, e.g. an aliphatic alcohol, acetone or tetrahydrofuran, to be added to the aqueous alkaline developers. After development, the resulting resist image is generally freed from residual developer and dried.

The novel resist layers not only possess very good exposure properties but in particular also exhibit wide latitude with regard to development and exposed parts of the layer which are very resistant to the aqueous developers. For example, resist images having very fine lines and structures can be reproduced exactly and faithfully to the original without, for example, fine image elements becoming detached. The areas of the substrate which are bared as a result of development of the resist image can then be modified permanently in a conventional manner, for example by metal deposition, etching or doping. The resist according to the invention is also very resistant to the process chemicals used in this procedure, in particular the electroplating and/or etching baths. After permanent modification of the substrate, the resist image can, if desired, be removed from the substrate by stripping with a suitable solvent. However, the resist image may furthermore remain on the substrate, as a permanent protective or insulating layer. The dry film resist according to the invention and the novel process for the production of resist images are suitable for all applications for which imagewise structured resist layers are known to be used, for example as etch resists and plating resists in the production of printed circuit boards and printed circuits, for the production of thin-film circuits or multilayer circuits, etc.

The Examples which follow illustrate the invention. Parts and percentages are by weight, unless stated otherwise.

I. Synthesis of the oligomers

SYNTHESIS EXAMPLE 1

The bisphenol A diglycidyl ether prepared from bisphenol A and epichlorohydrin was reacted with adipic acid and acrylic acid in a molar ratio of 2:1:2 to give a resin containing hydroxyl and acryloyl groups and having an OH equivalent weight of 270. 148 parts (1 equivalent) of phthalic anhydride, 2.5 parts of dimethylaminopyridine, 1 part of di-tert.-butyl-p-cresol and 84 parts of ethyl acetate were added to a solution of 386 parts of this hydroxyl-containing starting resin (70% strength in ethyl acetate), and the reaction mixture was then heated to 80° C. and kept at this temperature for 5 hours. Thereafter, 40 parts of pentaerythritol triglycidyl ether and a further 2.5 parts of dimethylaminopyridine were added to the solution of the resulting reaction product, the reaction was continued for a further 5 hours at 80° C. and the mixture was then cooled to room temperature and diluted with a further 259 parts of ethyl acetate.

The solids content of the resin solution prepared in this manner was 46%. The acryloyl-containing oligomeric resin had an acid number of 119 mg of KOH per g and was soluble in 1% strength aqueous sodium carbonate solution.

SYNTHESIS EXAMPLE 2

45 parts of butane-1,4-diol, 3 parts of di-tert.-butyl-p-cresol, 3 parts of dibutyltin laurate and 240 partS of ethyl acetate were added to a solution of 1543 parts of the hydroxyl-containing starting resin of Synthesis Example 1 (70% strength in ethyl acetate). This solution was heated to 45° C., after which 168 parts of hexamethylene diisocyanate were added to the stirred solution in the course of 10 minutes, and the reaction solution was then kept at 70° C. for a further hour. 355.2 parts of phthalic anhydride and 7.5 parts of dimethylaminopyridine were added to the solution of the resulting reaction product, and the mixture was then allowed to react for 4 hours at 80° C. It was then diluted with 942 parts of ethyl acetate, while cooling to room temperature.

The solids content of the resulting resin solution was 49%. The acid number of the oligomeric resin was determined as 99 mg of KOH per g.

SYNTHESIS EXAMPLE 3

500 parts of the hydroxyl-containing starting resin (70% strength in ethyl acetate) prepared in Synthesis Example 1, 172.6 parts of phthalic anhydride, 1.3 parts of di-tert.-butyl-p-cresol, 3.2 parts of dimethylaminopyridine and 74 parts of ethyl acetate were initially taken in a reaction kettle, and the mixture was heated and kept at 77° C. for 4 hours. Thereafter, 81.3 parts of the diglycidyl ether obtained from epichlorohydrin and bisphenol A, 2.9 parts of dimethylaminopyridine and 120 parts of ethyl acetate were added to the resulting reaction solution, and the reaction was continued for a further 5 hours at 77° C. The mixture was then cooled to room temperature and diluted with 260 parts of ethyl acetate.

The solids content of the resin solution obtained in this manner was about 50%. The oligomeric resin was soluble in 1% strength aqueous sodium carbonate solution and had an acid number of 97 mg of KOH per g. II. Production of the photoresists

EXAMPLE 1

A homogeneous solution containing the following components was prepared with stirring:
54.7% of the oligomer prepared according to Synthesis Example 1 (46% strength in ethyl acetate),
20% of a copolymer of 66% of N-vinylpyrrolidone and 34% of vinyl propionate, having a Fikentscher K value of 49.9 (46% strength in tert.-butanol)
18% of trimethylolpropane triacrylate,
3.5% of benzophenone,
0.15% of Michler's ketone,
3% of 2,5-dichloro-1,4-bis(dichloromethyl)benzene,
0.5% of crystal violet leuco base,
0.05% of Sicomet Patent Blue 80 E 131 and
0.1% of di-tert.-butyl-p-cresol.

The solution was filtered through a pressure filter and then cast on a 23 μm thick polyethylene terephthalate film in a thickness such that evaporating the solvent in the air and drying for 3 minutes at 80° C. gave a dry film which was 35 μm thick. Until further processing of the resulting dry film resist, the photopolymerizable resist layer was covered with a 23 μm thick polyethylene film.

To produce a resist image, the polyethylene film of the dry film resist was peeled off, the photopolymerizable resist layer was laminated at from 80° to 120° C. with a copper-clad printed circuit board substrate and exposed imagewise to actinic light through a photographic negative, the polyethylene terephthalate base was peeled off and the said resist layer was then washed out with 1% strength aqueous sodium carbonate solution. The developed resist image was then dried. The bared parts of the copper surface were etched or electroplated in a commercial etching or electroplating bath. In ammoniacal and acidic etching baths, good or very good etch structures were obtained. For long processing times in the acidic plating baths, slight extraction of the water-soluble polymer by the plating electrolyte was observed; consequently, problems may be encountered during metal deposition over a prolonged period.

EXAMPLE 2

Example 1 was repeated, except that in this case, instead of the oligomer of Synthesis Example 1, 54.7% of the oligomer prepared according to Synthesis Example 2 (49% strength in ethyl acetate) were used for the production of the photopolymerizable resist layer. In this case, bleeding of organic substances into the acidic electroplating baths was more pronounced than in Example 1, so that this resist was essentially suitable for etching applications. The resist image produced otherwise had similar properties.

EXAMPLE 3

The procedure described in Example 1 was followed, except that in this case, instead of the oligomer of Synthesis Example 1, 50.7% of the oligomer of Synthesis Example 3 (about 50% strength in ethyl acetate) and in addition 4% of 2-ethylhexyl p-hydroxybenzoate were employed and the N-vinylpyrrolidone/vinyl propionate copolymer was replaced with the same amount of a copolymer of 60% of methyl methacrylate, 30% of N-vinylpyrrolidone and 10% of methacrylic acid (28% strength in methanol, K value 40). The resist images produced using these photoresist films were capable of being processed without difficulty in all etching and electroplating baths and gave very good results.

We claim:

1. A dry film resist possessing a solid photopolymerizable resist layer, which is laminatable and developable with an aqueous medium and is applied on a temporary, dimensionally stable base, the said photopolymerizable resist layer being formed from a homogeneous mixture consisting essentially of
   (a) not less than 40% by weight of one or more photopolymerizable oligomers which are soluble or disperible in aqueous alkaline solutions, contain free carboxyl groups and more than two acryloyl and-/or methacryloyl groups and have a mean molecular weight (number average) of from about 1000 to about 10,000, which oligomers are obtained by reacting a diol or polyol compound containing acryloyl and/or methacryloyl groups with an anhydride of a poly-basic carboxylic acid with esterification of some or all of the hydroxy groups of the diol or polyol compound and formation of the acidic partial ester of the poly-basic carboxylic acid, and further reaction of some of the free carboxyl groups of the resulting reaction product with a di- or polyepoxide, with chain extension and branching of the product,
   (b) from 1 to 35% by weight of one or more film-forming polymers which are soluble or dispersible in water or in aqueous alkaline solutions, are compatible with the oligomers of component (a) and have a mean molecular weight (weight average) greater than about 15,000,
   (c) from 1 to 30% by weight of one or more photopolymerizable monomers which are compatible with the oligomers of components (a) and the polymers of component (b),
   (d) from 0.001 to 10% by weight of one or more photopolymerizable initiators and
   (e) from 0 to 30% by weight of additives and/or assistants, the percentages in each case being based on the total mixture.

2. A dry film resist as claimed in claim 1 wherein the diol or polyol compound for the preparation of the oligomer or oligomers for component (a) is a diol or polyol obtained by reacting a di- or polyepoxide with an equivalent amount of acrylic acid and/or methacrylic acid.

3. A dry film resist as claimed in claim 1, wherein the oligomers present as component (a) in the photopolymerizable resist layer have on average from about 2.1 to 8 acryloyl and/or methacryloyl groups per molecule and an acid number of from 50 to 150.

4. A dry film resist as claimed in claim 1, wherein the polymer or polymers of component (b) is or are insoluble in water and soluble or dispersible in aqueous alkaline solutions.

5. A dry film resist as claimed in claim 1, which contains an N-vinylamide polymer as component (b).

6. A dry film resist as claimed in claim 5, wherein the polymer of component (b) is a copolymer which is insoluble in water but soluble or dispersible in aqeuous alkaline solutions and consists aof an N-vinyllactam, acrylic and/or methacrylic acid and one or more hydrophobic comonomers which as such form water-insoluble homopolymers.

7. A dry film resist as claimed in claim 1, wherein the polymer or polymers of component (b) is or are present in the photopolymerizable resist layer in an amount of from 10 to 30% by weight, based on the said resist layer.

8. A dry film resist as claimed in claim 1, which contains, as component (c), triacrylate, trimethacrylate, tetraacrylate and/or tetramethacrylate monomers.

9. A dry film resist as claimed in claim 1, wherein the monomers of component (c) are present in the photopolymerizable resist layer in an amount of from 10 to 25% by weight, based on the said resist layer.

10. A process for the production of a resist image on a substrate, comprising applying a solid, photopolymerizable resist layer, which is soluble or dispersible in aqueous developers, onto the substrate, exposing this resist layer imagewise to actinic light and washing out the unexposed parts of the resist layer with a developer, wherein the photo polymerizable resist layer is built from a film-forming homogeneous mixture consisting essentially of
   (a) not less than 40% by weight of one or more photopolymerizable oligomers which are soluble or dispersible in aqueous alkaline solutions, contain free carboxyl groups and more than two acryloyl and-/or methacryloyl groups and have a mean molecular weight (number average) of from about 1000 to about 10,000, which oligomers are obtained by reacting a diol or polyol compound containing acryloyl and/or methacryloly groups with an anhydride of a polybasic carboxylic acid with esterification of some or all of the hydroxyl groups of the diol or polyol compound and formation of the acidic partial ester of the polybasic carboxylic acid, and further reaction of some of the free carboxyl groups of the resulting reaction product with a di or-polyepoxide, with chain extension and branching of the product,
   (b) from 1 to 35% by weight of one or more film-forming polymers which are soluble or dispersible in water or in aqueous alkaline solutions, are compatible with the oligomers of component (a) and have a mean molecular weight (weight average) greater than about 15000, (c) from 1 to 30% by weight of one or more photopolymerizable monomers which are compatible with the oligomers of component (a) and the polymers of component (b), (d) from 0.001 to 10% by weight of one or more photopolymerization initiators and (e) from 0 to 30% by weight of further additives and/or assistants, the stated perecentages in each case being based on the total mixture.

11. A process as claimed in claim 10, wherein a prepared dry photopolymerizable resist layer is laminated with the substrate, any cover sheet present being peeled off from the photopolymerizable resist resist layer prior to lamination, and the temporary base being removed from the resist layer after lamination of the photopolymerizable resist layer with the substrate and either before or after the imagewise exposure.

12. A dry film resist as claimed in claim 1, wherein the diol or polyol compound for the preparation of the oligomer or oligomers for component (a) is a diol or polyol by reacting a di- or polyepoxide with an equivalent amount of acrylic acid and/or methacrylic acid.

13. A dry film resist as claimed in claim 1, wherein in component (a) said anhydride of the polybasic acid is a cyclic carboxylic anhydride.

14. A dry film resist as defined in claim 1, wherein a removable cover sheet is present on the resist layer.

* * * * *